United States Patent
Totsuka

(10) Patent No.: US 9,869,777 B2
(45) Date of Patent: Jan. 16, 2018

(54) SCINTILLATOR

(71) Applicant: Nihon Kessho Kogaku Co., Ltd., Tatebayashi (JP)

(72) Inventor: Daisuke Totsuka, Ageo (JP)

(73) Assignee: Nihon Kessho Kogaku Co., Ltd., Tatebayashi (JP)

( * ) Notice: Subject to any disclaimer, the term of this patent is extended or adjusted under 35 U.S.C. 154(b) by 0 days.

(21) Appl. No.: 15/322,206

(22) PCT Filed: Mar. 18, 2016

(86) PCT No.: PCT/JP2016/058703
§ 371 (c)(1),
(2) Date: Dec. 27, 2016

(87) PCT Pub. No.: WO2016/158495
PCT Pub. Date: Oct. 6, 2016

(65) Prior Publication Data
US 2017/0160407 A1  Jun. 8, 2017

(30) Foreign Application Priority Data

Mar. 31, 2015  (JP) .................. 2015-072606

(51) Int. Cl.
| | |
|---|---|
| *C09K 11/00* | (2006.01) |
| *C09K 11/61* | (2006.01) |
| *G01T 1/20* | (2006.01) |
| *G01T 1/202* | (2006.01) |
| *G21K 4/00* | (2006.01) |
| *C30B 29/12* | (2006.01) |
| *C30B 11/00* | (2006.01) |
| *C30B 11/06* | (2006.01) |
| *C09K 11/74* | (2006.01) |

(52) U.S. Cl.
CPC ........ *G01T 1/2023* (2013.01); *C09K 11/7435* (2013.01); *C30B 11/002* (2013.01); *C30B 11/003* (2013.01); *C30B 11/065* (2013.01); *C30B 29/12* (2013.01)

(58) Field of Classification Search
CPC .......................... C09K 11/7435; G01T 1/2023
See application file for complete search history.

(56) References Cited

U.S. PATENT DOCUMENTS

| | | | |
|---|---|---|---|
| 2008/0302970 A1 | 12/2008 | Fujieda et al. | |
| 2014/0203211 A1* | 7/2014 | Totsuka ............ | C09K 11/7435 252/301.4 H |

FOREIGN PATENT DOCUMENTS

| | | | | |
|---|---|---|---|---|
| JP | 2008215951 A | 9/2008 | | |
| WO | 2013027671 A1 | 2/2013 | | |
| WO | WO-2013027671 A1 * | 2/2013 | ......... | C09K 11/7435 |
| WO | 2016/081470 A1 | 5/2016 | | |

OTHER PUBLICATIONS

Zhu, Ren-yuan, "Scintillating Crystals for Precision Crystal Calorimetry in High Energy Physics", The American Institute of Physics, 1998, pp. 25-38, California Institute of Technology, Pasadena, CA, US.
Wu, Yuntao et al., "Effects of Bi3+codoping on the optical and scintillation properties of CsI:TI single crystals", Physica Status Solidi, 2014, 211(11), pp. 2586-2591, Weinheim, DE.
Gektin, A.V. et al., "The Effect of Bi- and Threevalent Cation Impurities on the Luminescence CsI", Nuclear Science Sumposium & Medical Imaging Conference, 1994 IEEE Conference Record, 1995, pp. 111-113, vol. 1.
Sektin, A.V. et al., "The Effect of Bi- and Threevalent Cation Impurities on the Luminescence CsI", IEEE Transactions on Nuclear Science, Aug. 1995, pp. 285-287, vol. 42, No. 4.
Totsuka, D. et al., "Afterglow Suppression by Codoping with Bi in CsI:TI Crystal Scintillator", Applied Physics Express 5, 2012, pp. 052601-1-52601-3.

* cited by examiner

*Primary Examiner* — C Melissa Koslow
(74) *Attorney, Agent, or Firm* — The Webb Law Firm

(57) ABSTRACT

Provided is a scintillator having a crystal containing CsI (cesium iodide) as a host material thereof and thallium (Tl) and bismuth (Bi), and a novel scintillator which maintains a high output and simultaneously can further enhance the afterglow characteristics. There is proposed a scintillator having a crystal containing CsI (cesium iodide) as a host material thereof and Tl, Bi and O, wherein the concentration a of Bi with respect to Cs in the crystal is 0.001 atomic ppm≤a≤5 atomic ppm; and the ratio (a/b) of the concentration a of Bi with respect to Cs in the crystal to the concentration b of O with respect to I in the crystal is $0.005 \times 10^{-4}$ to $200 \times 10^{-4}$.

2 Claims, 2 Drawing Sheets

SCINTILLATOR

CROSS-REFERENCE TO RELATED APPLICATIONS

This application is the United States national phase of International Application No. PCT/JP2016/058703 filed Mar. 18, 2016, and claims priority to Japanese Patent Application No. 2015-072606 filed Mar. 31, 2015, the disclosures of which are hereby incorporated in their entirety by reference.

TECHNICAL FIELD

The present invention relates to a scintillator suitably usable, for example, for an X-ray detector.

BACKGROUND ART

Scintillators are substances which absorb radiations such as γ-rays or X-rays and emit visible light or electromagnetic waves of wavelengths near those of visible light. Examples of their applications include various types of radiation detectors such as medical PET (positron emission tomography equipment) and TOF-PET (time-of-flight positron emission tomography equipment), X-ray CT (X-ray computed tomography equipment), belongings inspection equipment used in airports and the like, cargo inspection equipment used in harbors and the like, oil search equipment, further exposure dose measurement equipment and high-energy particle measurement equipment.

Such radiation detectors are generally constituted of a scintillator section to receive radiations and convert it to visible light, and a light detection section, such as a photomultiplier tube (hereinafter, referred to as "PMT") or a photodiode, to detect the visible light converted in and transmitted from the scintillator section and convert it to electric signals. Then, scintillators used in such applications are, in order to make noises low and measurement precision high, desired to be ones high in the luminescent output.

As scintillators, alkali halide crystals such as CsI and NaI are conventionally broadly put into practical use. Among these, a scintillator having CsI as a host material thereof is utilized from the point that the radiation absorption efficiency is relatively high, the point that the radiation damage is relatively small, the point that the thin film fabrication is relatively easy by a vacuum deposition method or the like, and other points.

However, since the luminescent efficiency of conventional CsI scintillators is not very high, CsI scintillators in which a crystal having CsI as a host material thereof is doped with impurities to enhance the scintillation efficiency, and CsI:Na, CsI:Tl and the like in which TlI (thallium iodide) is doped are put into practical use.

For example, Japanese Patent Laid-Open No. 2008-215951 discloses a cesium iodide:thallium (CsI:Tl) in which cesium iodide is doped with thallium (Tl).

Further International Publication No. WO 2013/027671 discloses a scintillator improved in the afterglow characteristics, in which a crystal material containing CsI (cesium iodide) as a host material thereof and thallium (Tl) as a luminescent center thereof is doped with bismuth (Bi).

As a result of studies carried out on a scintillator disclosed in the above International Publication No. WO 2013/027671, that is, on a scintillator having a crystal containing CsI (cesium iodide) as a host material thereof and thallium (Tl) and bismuth (Bi), it has been made clear that by regulating the concentration of bismuth (Bi) in a predetermined low range, the output is maintained, and the afterglow characteristics can be simultaneously improved. It has also been made clear, however, that only by simply making the concentration of bismuth (Bi) low, it is difficult to maintain the high output and simultaneously further enhance the afterglow characteristics.

SUMMARY OF THE INVENTION

Then, the present invention relates to a scintillator which has a crystal containing CsI (cesium iodide) as a host material thereof and thallium (Tl) and bismuth (Bi), and aims to provide a novel scintillator which maintains a high output and simultaneously can further enhance the afterglow characteristics.

The present invention proposes a scintillator having a crystal containing CsI (cesium iodide) as a host material thereof and Tl, Bi and O, wherein the concentration a of Bi with respect to Cs in the crystal is 0.001 atomic ppm≤a≤5 atomic ppm; and the ratio (a/b) of the concentration a of Bi with respect to Cs in the crystal to the concentration b of O with respect to I in the crystal is $0.005 \times 10^{-4}$ to $200 \times 10^{-4}$.

The present invention relates to a scintillator having a crystal containing CsI (cesium iodide) as a host material thereof and thallium (Tl), bismuth (Bi) and oxygen (O), and has succeeded in maintaining a high output and simultaneously further enhancing the afterglow characteristics by maintaining the ratio (a/b) of the concentration a of Bi with respect to Cs in the crystal to the concentration b of O with respect to I in the crystal, in a predetermined range, and simultaneously reducing and regulating the concentration a of Bi with respect to Cs in the crystal, in a predetermined range. Therefore, the scintillator proposed by the present invention, for example, by being combined with a PD (photodiode) as a detector, can further enhance the output of a radiation detector, and can make images of the radiation detector more distinct and suitably take images of subjects moving in a baggage inspection machine or the like.

DETAILED DESCRIPTION OF THE INVENTION

Figure 1:
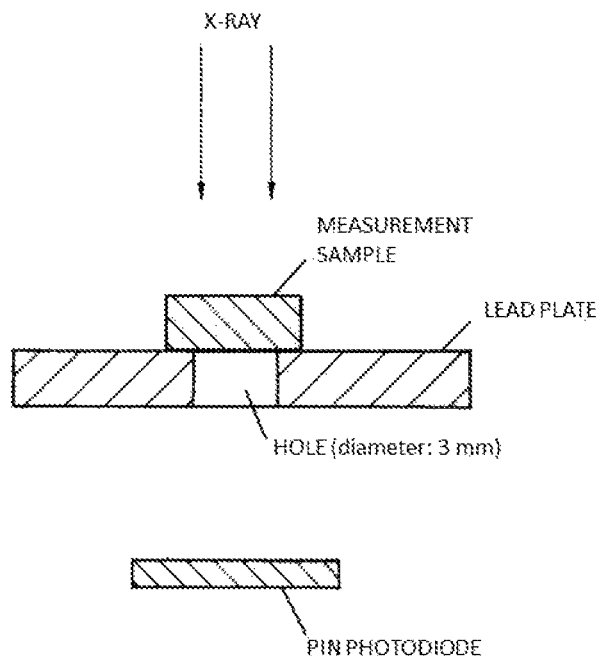
FIG. 1 is a view illustrating a constitution (outline) of an apparatus used for measurement of an output in Examples.

Hereinafter, the embodiment according to the present invention will be described in detail. However, the scope of the present invention is not limited to the embodiment to be described in the below.

(Scintillator)

A scintillator (hereinafter, referred to as "the present scintillator") according to the present embodiment is a scintillator having a crystal containing CsI (cesium iodide) as a host material thereof and Tl, Bi and O.

The host material of the present scintillator may contain, in addition to CsI (cesium iodide), a Tl compound or a Bi compound or the both. That is, the host material of the present scintillator may be composed of CsI (cesium iodide), or may contain CsI (cesium iodide) and a Tl compound or a Bi compound or the both.

Here, the Tl compound and the Bi compound are a Tl raw material and a Bi raw material to be described later, or compounds thereof.

By doping a crystal material containing CsI (cesium iodide) as a host material thereof and thallium (Tl) as a luminescent center thereof, with bismuth (Bi), the afterglow, which is a problem of such a scintillator, can be reduced to some degree. Such an action that the afterglow of the scintillator can be reduced is probably conceivably because luminescent energies of lattice defects and the like present inherently in the CsI crystal are consumed in a non-luminescent state by the transition energy of bismuth (Bi).

Particularly by maintaining the ratio (a/b) of the concentration a of Bi with respect to Cs in the crystal to the concentration b of O with respect to I in the crystal, in a predetermined range, and simultaneously reducing and regulating the concentration a of Bi with respect to Cs in the crystal, in a predetermined range, the afterglow characteristics can further be enhanced, with a high output being maintained.

From such a viewpoint, the concentration a of bismuth (Bi) with respect to Cs in the crystal is preferably 0.001 atomic ppm≤a≤5 atomic ppm, more preferably 0.001 atomic ppm or higher and 1 atomic ppm or lower, and especially preferably 0.003 atomic ppm or higher and 0.5 atomic ppm or lower. By making the concentration a of bismuth (Bi) to be 5 atomic ppm or lower, the afterglow reduction effect can be exhibited without impairing the output characteristic. On the other hand, by making the concentration a of bismuth (Bi) to be 0.001 atomic ppm or higher, the effect of low afterglow can be attained.

At this time, in order to further enhance the afterglow characteristics with a high output being maintained, it is preferable to regulate the ratio (a/b) of the concentration a of Bi with respect to Cs in the crystal to the concentration b of O with respect to I in the crystal, in a predetermined range, as described above.

From such a viewpoint, the ratio (a/b) of the concentration a of Bi with respect to Cs to the concentration b of O with respect to I in the crystal is preferably $0.005 \times 10^{-4}$ to $200 \times 10^{-4}$, more preferably $0.01 \times 10^{-4}$ or higher and $100 \times 10^{-4}$ or lower, and especially preferably $0.05 \times 10^{-4}$ or higher and $50 \times 10^{-4}$ or lower.

The content of oxygen (O) with respect to I in the crystal is not especially limited as long as the ratio (a/b) is in the above range.

However, the concentration b of O with respect to I in the crystal is preferably 0 atomic %<b≤0.30 atomic %, more preferably 0.001 atomic % or higher and 0.10 atomic % or lower, and especially preferably 0.01 atomic % or higher and 0.08 atomic % or lower.

By making oxygen (O) to be contained in such a concentration range, the performance, which cannot be attained only by simply making a small amount of bismuth (Bi) to be contained, can be attained, that is, the afterglow can further be reduced with a high output being maintained.

The content of thallium (Tl) in the crystal is not especially limited. As a sort of measure, the concentration of thallium (Tl) with respect to Cs of CsI is preferably 100 atomic ppm to 10,000 atomic ppm, and especially preferably 300 atomic ppm or higher and 4,000 atomic ppm or lower. When the concentration of thallium (Tl) is 100 atomic ppm or higher, the luminescent efficiency of scintillation of a grown crystal can sufficiently be attained. On the other hand, when being 10,000 atomic ppm or lower, it can be avoided that the amount of light emission becomes less due to concentration quenching.

Here, in order to make the above-mentioned concentration of Bi with respect to Cs, the target concentration of Bi, in other words, the blend amount thereof in production of the present scintillator is made to be preferably 0.01 atomic % or lower, and more preferably 0.00001 atomic % or higher and 0.01 atomic % or lower.

Further in order to make the above-mentioned concentration of Tl with respect to Cs, the target concentration of Tl is made to be preferably 0.05 atomic % or higher and 1.00 atomic % or lower.

The form of the present scintillator may be any form of a bulk form, a column form or a thin film. In any case, the effect of reducing the afterglow can be attained.

Further the present scintillator may be a single crystal or a polycrystal. Regardless of whether the present scintillator is a single crystal or a polycrystal, the effect of being capable of reducing the afterglow can be attained.

Here, in the present invention, a "single crystal" refers to a crystal body recognized as a CsI single-phase one when the crystal is measured by XRD.

(Production Method)

Then, one example of a production method of the present scintillator will be described. However, the production method of the present scintillator is not limited to a method described in the below.

Scintillator crystals usually come to internally include crystal defects and strains in their production process. By contrast, in the present scintillator, by slightly feeding oxygen together with Bi in crystal growth of CsI, Bi and O exhibit a dispersant-like effect on Tl; Tl is prevented from locally becoming high in concentration and crystal defects and strains can be reduced; then, a high output and a low afterglow can be attained.

The present scintillator can be obtained by mixing raw materials containing a CsI raw material, a Tl raw material and a Bi raw material, heating and melting the mixture, and thereafter growing the mixture as a crystal.

At this time, the Tl raw material and the Bi raw material include halides such as iodides, oxides, metals, metal compounds and the like of Tl and Bi. However, these raw materials are not limited thereto.

A crystal growth method at this time is not especially limited, and there can suitably be employed a well-known crystal growth method, including, for example, a Bridgman-Stockbarger method (referred to also as "BS method"), a temperature gradient freezing method (for example, a VGF method), a Czochralski method (referred to also as "CZ method"), a Kyropoulos method, a micro-pulling-down method, a zone melt method, an improved method thereof or another melt growth method.

Hereinafter, the representative BS method and CZ method will be described.

The BS method is a method in which raw materials are put and melted in a crucible and a crystal is grown from the crucible bottom while the crucible is being pulled down. The crystal growth apparatus is relatively inexpensive and has a feature of being capable of relatively easily growing a large-diameter crystal. On the other hand, since the control of the crystal growth orientation is difficult and a forcible stress is exerted in crystal growth and cooling, it is said that a stress distribution remains in a crystal, and strains and dislocations are liable to be induced.

On the other hand, the CZ method is a method in which raw materials are put and melted in a crucible; and a seed crystal is brought into contact with the melt surface and a crystal is grown (crystallized) while being rotated and pulled up. The CZ method, since being capable of crystallization by specifying the crystal orientation, is said to be easy in growth in a target crystal orientation.

One example of the BS method, which is one example of crystal growth methods, will be described more specifically.

For example, a CsI powder, a TlI powder and a $BiI_3$ powder to become raw materials are weighed in predetermined amounts and mixed; and the mixture is put into a quartz crucible, and the crucible is sealed, as required, under vacuumizing. As required, a seed crystal may be put on the crucible bottom. The quartz crucible is set in a crystal growth apparatus. At this time, in the case where the crucible is not sealed, it is preferable that the atmosphere in the crystal growth apparatus is suitably selected by regulating the oxygen concentration. The quartz crucible is heated to the melting point or a higher temperature than that by a heating apparatus to thereby melt the raw materials put into the crucible.

After the raw materials in the crucible are melted, when the crucible is pulled vertically downward at a speed of about 0.1 mm/hr to 3 mm/hr, the raw materials having become a melt start to be solidified from the crucible bottom and a crystal is grown. The pulling-down of the crucible is finished at the stage that all the melt in the crucible has been solidified, and the crucible is cooled down to nearly room temperature by being slowly cooled by the heating apparatus to be thereby able to grow an ingot-shape crystal.

In any crystal growth method, when the present scintillator is produced, it is important to regulate the mixing amount of the Bi raw material and regulate the amount of oxygen in the atmosphere in crystal growth.

For example, after raw materials are put into a crucible, by making heating to be carried out by regulating the oxygen concentration in the crucible by vacuumizing the crucible interior with a pump or the like, the oxygen concentration in a crystal can be regulated.

Alternatively, a crucible whose part is opened is used and after raw materials are put into the crucible in the air, by making heating to be carried out by regulating the oxygen concentration in a heating furnace, the oxygen concentration in a crystal can also be regulated. At this time, the atmosphere in the heating furnace is preferably made to be, for example, an inert gas atmosphere slightly containing oxygen by making an inert gas such as $N_2$ flow.

The ingot-shape crystal body thus grown may be cut out into a predetermined size, and then processed into a desired scintillator shape.

As required, the crystal is allowed to be heat treated, but does not necessarily need to be heat treated.

A method of the heat treatment involves, for example, putting the crystal body grown in the above step in a container, setting the container in a heat treatment furnace, and uniformly heating the heat treatment furnace interior at a temperature of about 80% to 90% of the melting point to be thereby able to remove strains remaining in the crystal. The atmosphere in the heat treatment may be an inert gas atmosphere such as a high-purity argon (Ar) gas. However, the heat treatment is not limited to such a heat treatment method.

(Interpretation of Terms)

A "scintillator" in the present invention means a substance which absorbs radiation such as X-rays or γ-rays, and emits visible light or electromagnetic waves (scintillation light) of wavelengths (the wavelength range of the light may spread from near-ultraviolet to near-infrared) near those of visible light, and a constituting member of a radiation detector having such a function.

In the present invention, the case described as "X to Y" (X and Y are any numerals) includes, unless otherwise specified, a meaning of "X or more and Y or less" and also a meaning of "preferably more than X" or "preferably less than Y".

Further the case described as "X or more" (X is any numeral) or "Y or less" (Y is any numeral) includes an intention to the effect of "preferably more than X" or "preferably less than Y".

EXAMPLES

Hereinafter, Examples according to the present invention will be described. However, the scope of the present invention is not limited to the following Examples.

<Measurement of the Output>

An output (nA) and an afterglow (ppm) were measured by using a measurement apparatus illustrated in FIG. 1.

A measurement sample (scintillator plate) of 8 mm×8 mm×2 mm in thickness was used.

Here, the output is an output of a PIN photodiode when scintillation light generated in the measurement sample by irradiating the measurement sample with predetermined X-rays is received by the photodiode. The afterglow means an afterglow at a predetermined time after the X-ray irradiation.

A target composed of tungsten (W) was irradiated with electron beams of an applied voltage of 120 kV and an applied current of 20 mA and generated X-rays; and the measurement sample was irradiated with the X-rays, and an output by scintillation light and transmitted X-rays was measured by the PIN photodiode ("S1723-5", manufactured by Hamamatsu Photonics K.K.). Then, the scintillation light was shielded by covering a hole of a lead plate of 2.2 mm in thickness with a light-shielding tape, and an output by the transmitted X-rays alone was measured. Then, by subtracting the output by the transmitted X-rays, an output by the scintillation light was acquired.

<Measurement of the Afterglow>

X-rays were caused to be generated by irradiation of electron beams of 120 kV and 20 mA as in the above; and the measurement sample was irradiated for 1 s with the X-rays, and a current value (I) flowing in the PIN photodiode ("S1723-5", manufactured by Hamamatsu Photonics K.K.) was measured. Then, after the measurement sample was irradiated for 1 s with the X-rays, the irradiation with the X-rays was cut, and at 20 ms after the cut, a current value ($I_{20\ ms}$) flowing in the PIN photodiode was measured. Further in the state before the irradiation of the measurement sample with the X-rays, a current value flowing in the PIN photodiode was measured as a background value ($I_{bg}$), and an afterglow (@ 20 ms) was calculated from the following expression.

Afterglow(@20 ms)=$(I_{20\ ms}-I_{bg})/(I-I_{bg})$

<XRD Measurement>

In an X-ray diffraction (XRD) measurement, "RINT-TTRIII (50 kV, 300 mA)", manufactured by Rigaku Corp. was used as a measurement apparatus and a Cu target was used as an X-ray source, and an XRD pattern in the 2θ range of 10° to 80° was acquired.

<Measurements of the Elemental Concentrations>

A measurement method of the concentration of each element is described in the below.

That is, in the elemental analysis of Tl, an ICP-AES (model: SPS3525, apparatus manufacturer: Hitachi High-Tech Science Corp.) was used, and the concentration (atomic ppm) of Tl with respect to Cs of CsI was determined.

In the elemental analysis of Bi, an ICP-MS (model: XSEREIES2, apparatus manufacturer: Thermo Scientific Inc.) was used, and the concentration (atomic ppm) of Bi with respect to Cs of CsI was determined. Provided that in the case where the concentration of Bi was lower than 0.001 atomic ppm, since the variation in measurement values was large, the concentration is indicated as "<0.001" in Table 1. In this case, since there is no sense in indicating the ratio of Bi/O, the ratio is indicated as "-".

In the elemental analysis of O, an inert gas fusion non-dispersion type infrared absorption method (model: EMGA-620, apparatus manufacturer: HORIBA Ltd.) was used, and the concentration (atomic %) of O with respect to I of CsI was determined.

For the elemental analysis of O, a sample was used having a fresh surface obtained by cutting a bulky sample in a glove box filled with nitrogen as a pretreatment of the elemental analysis measurement of O.

<Checking of Segregation of Tl>

In checking the segregation of Tl, an Imaging-Dynamic-SIMS (referred to as "Dynamic SIMS", model: IMS-7f, apparatus manufacturer: AMETEK, Inc.) was used. The measurement sample was cut into a size of 5 mm×5 mm×2 mm in thickness; and as a pretreatment before the measurement, a sputtering treatment was carried out on the measurement surface to a depth of about 100 μm, and thereafter, the present measurement was carried out. An area of 50 μm×50 μm of the measurement region was irradiated with oxygen of primary ions to a depth of about 5 μm, and the secondary ion intensity data detected of $^{205}$Tl were three-dimensionally mapping processed.

Examples 1 and 3 to 11, and Comparative Examples 1 and 2 and 4

Figure 2:
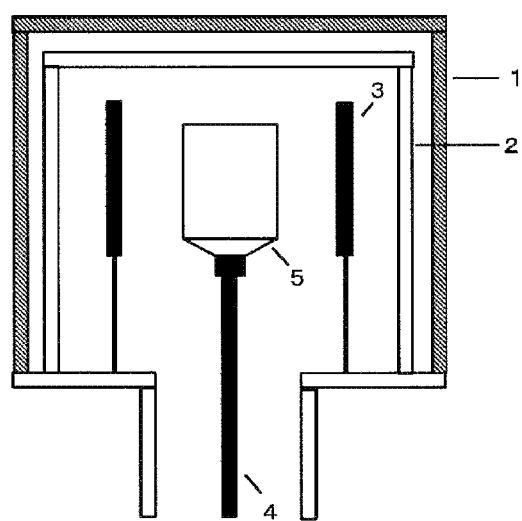
FIG. 2 is a view illustrating a constitution (outline) of a crystal growth apparatus used in production in Examples.

A CsI powder (99.999%), a TlI powder (99.999%) and further a BiI$_3$ powder (99.999%) were weighed in amounts indicated in Table 1, mixed in a mortar and set on a crystal growth apparatus 1 illustrated in FIG. 2, and a crystal was grown. Here, the doping amounts of Tl and Bi elements are indicated in atomic % with respect to a Cs element in CsI as a host material.

The crystal growth was carried out by the following vertical Bridgman method. That is, a hydrofluoric acid regulated to a hydrofluoric acid concentration of 10% was put into a quartz crucible 5 having a diameter of its cylindrical part of 45 mm, a length of 100 mm and its bottom part of a conical shape, and the quartz crucible was cleaned for 5 min. The quartz crucible thus cleaned was washed well with water, and thereafter air-dried.

The raw materials mixed in the mortar as described above were put into the quartz crucible thus pretreated, and heated to 300° C. by heater 3, surrounded by heat insulating material 2, and held at the temperature for 12 hours under vacuumization by which the crucible internal pressure (see Table 1) was made a predetermined one by using a rotary pump and an oil diffusion pump, to transpire moisture contained in the raw materials, and thereafter, with the vacuum state being maintained, the quartz was heated and melted by a burner to seal the raw materials.

Then, the quartz crucible was set in an furnace whose atmosphere was made to be nitrogen gas; and the quartz crucible was heated by the heater 3 until the raw materials became melted, and was held at the temperature for 24 hours after the melting of the raw materials. Thereafter, the quartz crucible was pulled down by a pull-down mechanism 4 at a speed of 0.5 mm/hr, and after being pulled down for 250 hours, the pulling down was discontinued and the heating of the heater was gradually suspended over 24 hours.

A crystal body thus obtained was cut out into a predetermined size and in a predetermined direction, to thereby obtain the respective measurement samples for the above.

Example 2 and Comparative Example 3

In Example 2 and Comparative Example 3, a quartz crucible having a diameter of its cylindrical part of 45 mm and a length of 100 mm and its opened upper end was used, and cleaned as in Example 1, and thereafter washed well with water and air-dried; thereafter, raw materials mixed in a mortar were put into the quartz crucible; the quartz crucible was set in a furnace, and N$_2$ was made to flow in the interior of the furnace in the air atmosphere and the flow volume of N$_2$ was regulated. The quartz crucible was heated up to 300° C. in that state, and thereafter held for 12 hours in the state to transpire moisture contained in the raw materials; and measurement samples were thereafter obtained as in Example 1. At this time, by controlling the flow volume of N$_2$, the oxygen concentration in the treatment atmosphere was varied.

Example 12

In Example 12, a measurement sample was obtained as in Example 1, except for using a quartz crucible having a diameter of its cylindrical part of 120 mm, a length of 230 mm and its bottom part of a conical shape.

TABLE 1

| | Tl Nominal Concentration (to Cs) (atomic %) | Tl Content Concentration (to Cs) (atomic ppm) | Bi Target Concentration (to Cs) (atomic %) | Bi Content Concentration (to Cs) (atomic ppm) | O Content Concentration (to I) (atomic %) | Bi/O (×10$^{-4}$) | Ampul Internal Pressure (Pa) | Afterglow (ppm @ 20 ms) | Output (nA) |
|---|---|---|---|---|---|---|---|---|---|
| Example 1 | 0.5 | 3456 | 0.00001 | 0.003 | 0.048 | 0.0625 | 3 × 10$^{-4}$ | 2,158 | 41.07 |
| Example 2 | 0.5 | 730 | 0.001 | 0.26 | 0.016 | 16.25 | N$_2$ flow | 909 | 39.90 |
| Example 3 | 0.2 | 1267 | 0.001 | 0.36 | 0.048 | 7.5 | 8 × 10$^{-5}$ | 830 | 35.12 |
| Example 4 | 0.2 | 1152 | 0.001 | 0.12 | 0.032 | 3.75 | 9 × 10$^{-5}$ | 690 | 40.26 |
| Example 5 | 0.5 | 2944 | 0.001 | 0.24 | 0.048 | 5 | 1 × 10$^{-4}$ | 951 | 40.97 |
| Example 6 | 0.5 | 2816 | 0.001 | 0.24 | 0.032 | 7.5 | 1 × 10$^{-3}$ | 643 | 31.92 |
| Example 7 | 0.5 | 3712 | 0.001 | 0.24 | 0.016 | 15 | 2 × 10$^{-4}$ | 1,062 | 36.68 |
| Example 8 | 0.5 | 2304 | 0.01 | 2.40 | 0.032 | 75 | 9 × 10$^{-5}$ | 1,482 | 27.82 |
| Example 9 | 0.5 | 1300 | 0.00001 | 0.001 | 0.032 | 0.0313 | 2 × 10$^{-4}$ | 1,470 | 38.55 |
| Example 10 | 0.5 | 1941 | 0.00001 | 0.003 | 0.032 | 0.0938 | 2 × 10$^{-4}$ | 1,011 | 42.63 |

TABLE 1-continued

|  | Tl Nominal Concentration (to Cs) (atomic %) | Tl Content Concentration (to Cs) (atomic ppm) | Bi Target Concentration (to Cs) (atomic %) | Bi Content Concentration (to Cs) (atomic ppm) | O Content Concentration (to I) (atomic %) | Bi/O ($\times 10^{-4}$) | Ampul Internal Pressure (Pa) | Afterglow (ppm @ 20 ms) | Output (nA) |
|---|---|---|---|---|---|---|---|---|---|
| Example 11 | 0.5 | 4060 | 0.00001 | 0.006 | 0.048 | 0.125 | $2 \times 10^{-4}$ | 1,418 | 38.84 |
| Example 12 | 0.3 | 1270 | 0.0001 | 0.081 | 0.032 | 2.53 | $2 \times 10^{-2}$ | 1,404 | 44.77 |
| Comparative Example 1 | 0.5 | 2304 | none | <0.001 | 0.016 | — | $1 \times 10^{-3}$ | 4,869 | 38.68 |
| Comparative Example 2 | 0.5 | 1165 | none | <0.001 | 0.048 | — | $2 \times 10^{-4}$ | 6,815 | 32.45 |
| Comparative Example 3 | 0.2 | 310 | none | <0.001 | 0.128 | — | $N_2$ flow | 4,844 | 37.93 |
| Comparative Example 4 | 0.5 | 1165 | 1 | 14 | 0.048 | 291.67 | $2 \times 10^{-4}$ | 2,809 | 21.55 |

(Results and Consideration)

A part of the crystal bodies each obtained in Examples 1 to 12 was crushed, and was subjected to a powder XRD measurement; it was then confirmed that any of the crystal bodies obtained in Examples 1 to 12 was a crystal body of a CsI single phase and there were no other phases.

From the above Examples and test results carried out by the present inventor, it was made clear that with respect to the scintillator having a crystal containing CsI (cesium iodide) as a host material thereof and Tl, Bi and O, by regulating the ratio (a/b) of the concentration a of Bi with respect to Cs in the crystal to the concentration b of O with respect to I in the crystal to be $0.005 \times 10^{-4}$ to $200 \times 10^{-4}$ and by making the concentration a of Bi with respect to Cs in the crystal to be 0.001 atomic ppm≤a≤5 atomic ppm, a high output can be maintained and simultaneously the afterglow characteristics can further be enhanced.

Figure 3:
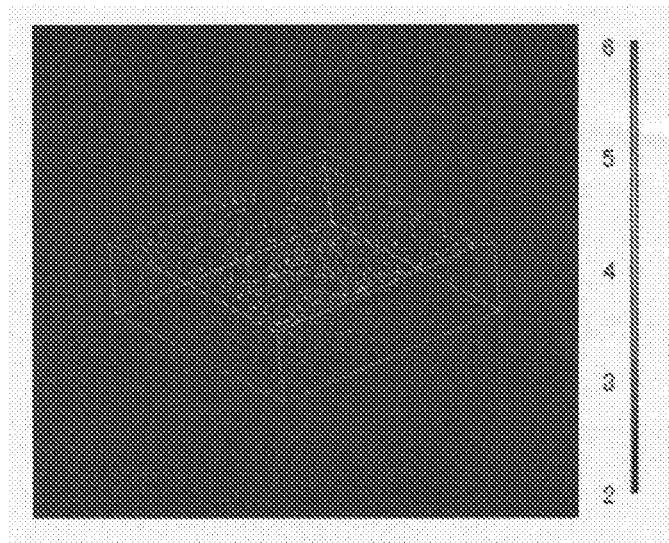
FIG. 3 is an image of a dynamic SIMS of a crystal body (measurement sample) obtained in Example 8.
Figure 4:
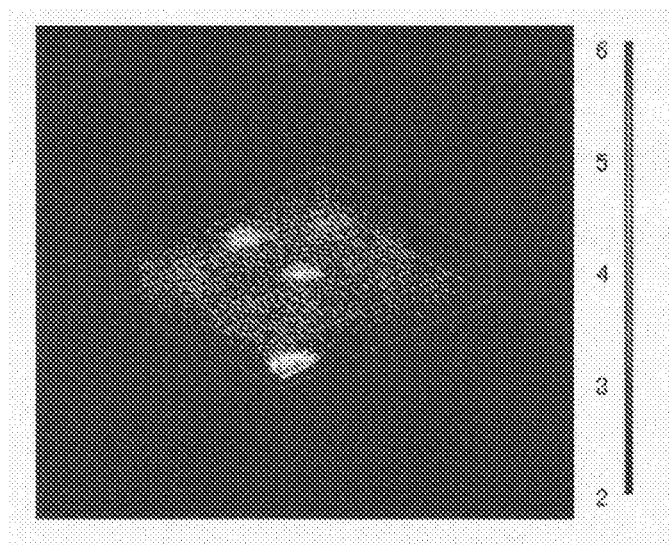
FIG. 4 is an image of a dynamic SIMS of a crystal body (measurement sample) obtained in Comparative Example 1.

As a result of observation by a dynamic SIMS of Tl on the scintillators of Examples 1 to 12 and Comparative Example 1, it was confirmed as shown in FIG. 3 that, in Example 8, Tl was dispersed homogeneously, whereas it was confirmed as shown in FIG. 4 that, in Comparative Example 1, Tl was segregated.

All Examples other than Example 8 exhibited the same tendency, and it could be confirmed that since the concentrations of Bi and the concentrations of O were in predetermined ranges, Bi and O exhibited the effect as dispersants of dispersing Tl.

Here, although the tests of the above Examples were carried out using bulk-form scintillators, the case where scintillators of a column form or a thin film are fabricated, since in this case, the lattice defects in the CsI crystal become large, can be expected to exhibit the larger effect than the bulk form. That is, regardless of whether a scintillator is of a bulk form, a column form or a thin film, there can be expected the effect equal to or larger than the effect at least in the case where a bulk-form scintillator is used.

The invention claimed is:

1. A scintillator, comprising a crystal comprising CsI (cesium iodide) as a host material thereof and Tl, Bi and O, wherein a concentration a of Bi with respect to Cs in the crystal is 0.001 atomic ppm≤a≤5 atomic ppm; and a ratio (a/b) of the concentration a of Bi with respect to Cs in the crystal to a concentration b of O with respect to I in the crystal is $0.005 \times 10^{-4}$ to $200 \times 10^{-4}$.

2. The scintillator according to claim 1, wherein the concentration b of O with respect to I in the crystal is 0 atomic %<b≤0.30 atomic %.

* * * * *